US008937313B2

(12) United States Patent
Chung et al.

(10) Patent No.: US 8,937,313 B2
(45) Date of Patent: Jan. 20, 2015

(54) SEMICONDUCTOR DEVICE AND METHOD OF MANUFACTURING THE SAME (75) Inventors: Yun-Mo Chung, Yongin-si (KR); Ki-Yong Lee, Cheonan-si (KR); Jin-Wook Seo, Seoul (KR); Jong-Ryuk Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/477,802

(22) Filed: May 22, 2012

(65) Prior Publication Data

US 2013/0175534 A1 Jul. 11, 2013

(30) Foreign Application Priority Data

Jan. 10, 2012 (KR) .................. 10-2012-0003039

(51) Int. Cl.
*H01L 29/786* (2006.01)
*H01L 21/20* (2006.01)
*B82Y 99/00* (2011.01)
*B82Y 40/00* (2011.01)

(52) U.S. Cl.
USPC ............... 257/66; 257/192; 257/72; 257/40; 438/479; 438/34

(58) Field of Classification Search
CPC ..... H01L 21/336; H01L 21/31; H01L 29/786; H01L 21/78
USPC .......................... 257/40, 642, 643, 759, 655
See application file for complete search history.

(56) References Cited

U.S. PATENT DOCUMENTS

| 4,814,842 | A | * | 3/1989 | Nakagawa et al. | 257/65 |
| 5,424,230 | A | * | 6/1995 | Wakai | 438/166 |
| 6,103,556 | A | * | 8/2000 | Nishimura et al. | 438/149 |
| 6,703,264 | B2 | * | 3/2004 | Yamazaki et al. | 438/149 |
| 7,285,809 | B2 | * | 10/2007 | Tanabe et al. | 257/292 |
| 7,754,573 | B2 | * | 7/2010 | Kim | 438/303 |
| 7,952,095 | B2 | * | 5/2011 | Oue et al. | 257/59 |
| 2004/0219802 | A1 | * | 11/2004 | Park et al. | 438/780 |
| 2006/0290634 | A1 | * | 12/2006 | Hwang | 345/92 |
| 2007/0108472 | A1 | * | 5/2007 | Jeong et al. | 257/192 |
| 2009/0117692 | A1 | * | 5/2009 | Koyama et al. | 438/164 |
| 2009/0272928 | A1 | | 11/2009 | Alvarez et al. | |
| 2010/0224881 | A1 | * | 9/2010 | Park et al. | 257/71 |
| 2010/0224882 | A1 | * | 9/2010 | Lee et al. | 257/72 |
| 2011/0193067 | A1 | * | 8/2011 | Lee et al. | 257/40 |
| 2012/0034451 | A1 | * | 2/2012 | Seo et al. | 428/332 |

FOREIGN PATENT DOCUMENTS

| JP | 2007-005411 A | 1/2007 |
| KR | 10-2000-0059403 A | 10/2000 |
| KR | 10-0473996 B1 | 2/2005 |
| KR | 10-2009-0107700 A | 10/2009 |
| KR | 10-2010-0104242 | * 10/2010 |

* cited by examiner

*Primary Examiner* — Marc Armand
*Assistant Examiner* — Quinton Brasfield
(74) *Attorney, Agent, or Firm* — Knobbe, Martens, Olson & Bear, LLP (57) ABSTRACT

A semiconductor device and a method of manufacturing the same are disclosed. In one embodiment, the semiconductor device includes a substrate, a first silicon nitride layer formed over the substrate, a first silicon oxide layer formed directly on the first silicon nitride layer and having a thickness of about 1000 Å or less, and a hydrogenated polycrystalline silicon layer formed directly on the first silicon oxide layer.

8 Claims, 7 Drawing Sheets

$H_1 \leq 1000 Å$

SEMICONDUCTOR DEVICE AND METHOD OF MANUFACTURING THE SAME

This application claims priority from Korean Patent Application No. 10-2012-0003039 filed on Jan. 10, 2012 in the Korean Intellectual Property Office, the disclosure of which is incorporated herein by reference in its entirety.

BACKGROUND

1. Field

The described technology generally relates to a semiconductor device and a method of manufacturing the same.

2. Description of the Related Technology

In general, a polycrystalline silicon layer is widely used as a semiconductor layer of a thin-film transistor (TFT) because the polycrystalline silicon layer has high charge mobility, can be applied to a high-speed operating circuit, and can be used to configure a complementary metal oxide semiconductor (CMOS) circuit. A TFT using a polycrystalline silicon layer is typically used as a switching device or a driving device of a display, e.g., an organic light-emitting diode (OLED).

SUMMARY

One inventive aspect is a semiconductor device which has improved transistor characteristics and secured uniformity of transistor characteristics since defects inside a polycrystalline silicon layer are cured.

Another aspect is a method of manufacturing a semiconductor device which has improved transistor characteristics since defects inside a polycrystalline silicon layer are cured.

Another aspect is a semiconductor device comprising: a substrate; a first silicon nitride layer formed over the substrate; a first silicon oxide layer formed directly on the first silicon nitride layer and having a thickness of about 1000 Å or less; and a hydrogenated polycrystalline silicon layer formed directly on the first silicon oxide layer.

Another aspect is a semiconductor device comprising: a substrate; a first buffer layer formed over the substrate, wherein the first buffer layer contains hydrogen; and an active layer formed on the first buffer layer and containing polycrystalline silicon and hydrogen, wherein the concentration of the hydrogen contained in the active layer is about 1 atomic percent (at. %) or more.

Another aspect is a method of manufacturing a semiconductor device, the method comprising: forming a first silicon nitride layer over a substrate, wherein the first silicon nitride layer contains hydrogen; forming a first silicon oxide layer on the first silicon nitride layer; forming an amorphous silicon layer directly on the first silicon oxide layer; and heat-treating the first silicon nitride layer, the first silicon oxide layer and the amorphous silicon layer so as to form a hydrogenated polycrystalline silicon layer.

DETAILED DESCRIPTION

Researches have been widely conducted on technologies for crystallizing an amorphous semiconductor layer formed on an insulating substrate (such as glass) into a semiconductor layer having a crystalline structure. Examples of crystallization techniques used to crystallize the amorphous semiconductor layer include solid phase crystallization, metal induced crystallization, and super grain silicon crystallization. However, polycrystalline silicon formed using these crystallization techniques has various defects such as dangling bonds, and these defects impede the movement of carriers that carry charges in the silicon.

Embodiments will now be described more fully with reference to the accompanying drawings. The described embodiments may, however, be modified in different forms and the present disclosure should not be limited to the embodiments set forth herein. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated about 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate embodiments and is not a limitation on the scope of the present disclosure unless otherwise specified. Further, unless defined otherwise, all terms defined in generally used dictionaries may not be overly interpreted.

The profile of an exemplary view may be modified according to manufacturing techniques and/or allowances. Regions shown in the drawings are illustrated in schematic form and the shapes of the regions are presented simply by way of illustration and not as a limitation.

Figure 1:
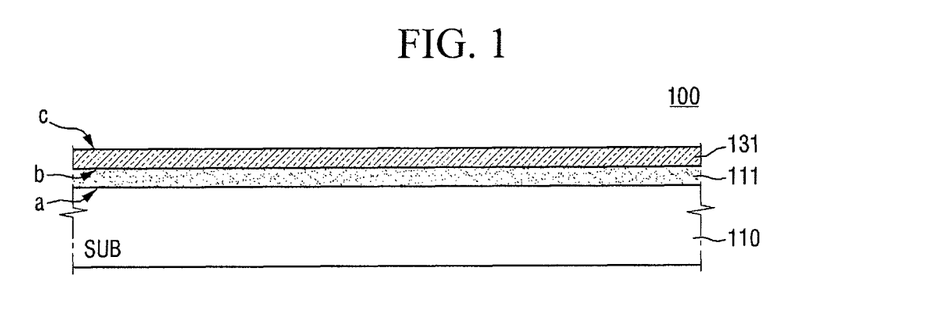
FIG. 1 is a cross-sectional view of a semiconductor device according to an embodiment.
Figure 2:
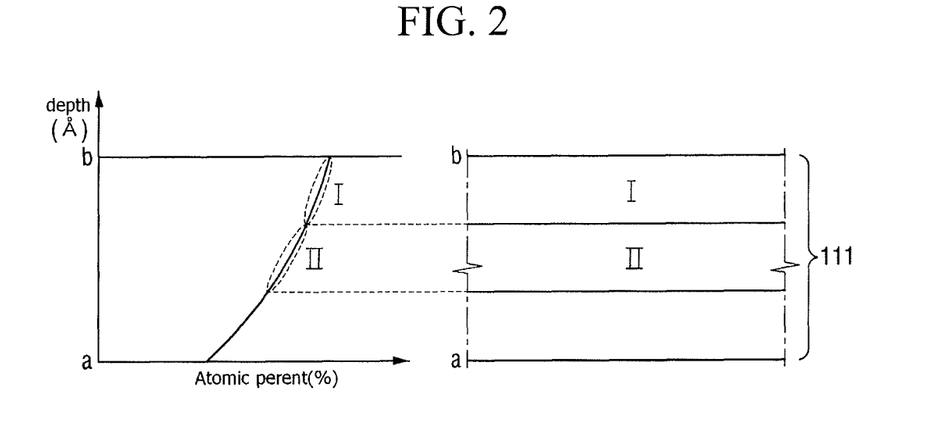
FIG. 2 is a graph illustrating the distribution of hydrogen in a first buffer layer of the semiconductor device shown in FIG. 1.
Figure 3:
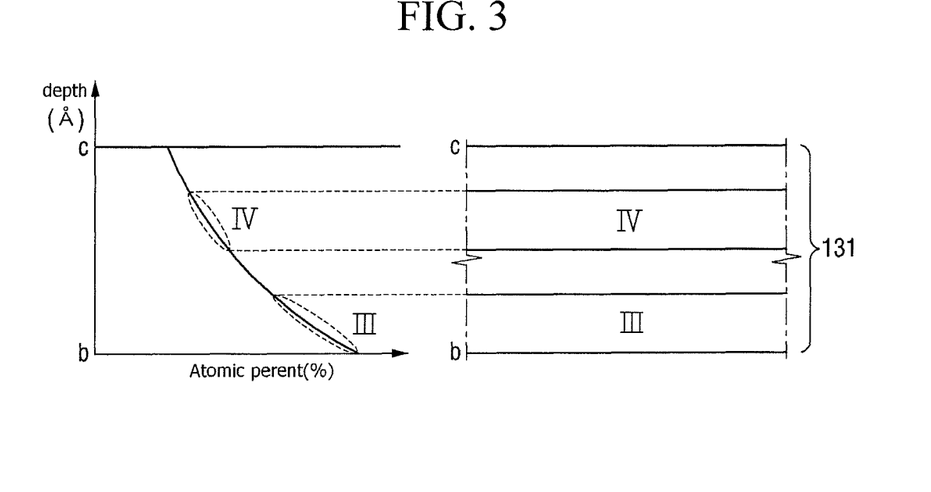
FIG. 3 is a graph illustrating the distribution of hydrogen in a polycrystalline silicon layer of the semiconductor device shown in FIG. 1.

A semiconductor device according to an embodiment will be described with reference to FIGS. 1 through 3. FIG. 1 is a cross-sectional view of a semiconductor device 100 according to an embodiment. FIG. 2 is a graph illustrating the distribution of hydrogen in a first buffer layer 111 of the semiconductor device 100 shown in FIG. 1. FIG. 3 is a graph illustrating the distribution of hydrogen in a polycrystalline silicon layer 131 of the semiconductor device 100 shown in FIG. 1.

Referring to FIG. 1, the semiconductor device 100 includes a substrate 110, the first buffer layer 111, and the polycrystalline silicon layer 131.

The substrate 110 may be an insulating substrate, specifically, a transparent insulating substrate. The substrate 110 may be made of, e.g., quartz, ceramic, or plastic. Further, the substrate 110 may be a flexible substrate. Alternatively, the substrate 110 may be a semiconductor substrate and may contain, e.g., Si, Ge, SiGe, GaP, GaAs, SiC, InAs, or InP.

The first buffer layer 111 may be formed on the entire surface of the substrate 110. The first buffer layer 111 prevents the penetration of impurities (such as alkali ions) from the substrate 110 into the polycrystalline silicon layer 131 and planarizes the surface of the substrate 110. In addition, the first buffer layer 111 may provide hydrogen that substantially cures defects of the polycrystalline silicon layer 131.

The first buffer layer 111 may be formed of an insulating layer that contains hydrogen. For example, the first buffer layer 111 may be formed of a silicon nitride layer that contains hydrogen. The hydrogen is defined as encompassing hydrogen atoms, hydrogen molecules, and hydrogen ions. The hydrogen may come from a source gas used to form the first buffer layer 111 and may remain in the first buffer layer 111. When the first buffer layer 111 is a silicon nitride layer, a hydrogen-containing gas may be used as a nitrogen source gas in the formation of the silicon nitride layer. Here, hydrogen may be introduced into the silicon nitride layer. The hydrogen existing in the first buffer layer 111 may be diffused to the polycrystalline silicon layer 131 by a heat treatment process performed to form the polycrystalline silicon layer 131. The first buffer layer 111 may be formed using, for example, chemical vapor deposition (CVD) or atomic layer deposition (ALD).

The distribution of hydrogen in the first buffer layer 111 will now be described with reference to FIG. 2. In FIG. 2, the X axis is the content of hydrogen atoms in the first buffer layer 111 represented in atomic percent (at. %), and the Y axis is the depth (Å) of the first buffer layer 111 in a direction from an upper surface b of the first buffer layer 111 toward the substrate 110. Referring to FIG. 2, the first buffer layer 111 includes a first region I and a second region II. The first region I is closer to the upper surface b of the first buffer layer 111 than the second region II. For example, the first region I may contact the upper surface b of the first buffer layer 111, and the second region II may be located under the first region I. In one embodiment, the number of hydrogen atoms in the first region I is greater than that of hydrogen atoms in the second region II. In FIG. 2, a case where the number of hydrogen atoms is reduced from the upper surface b of the first buffer layer 111 toward a lower surface a thereof is illustrated as an example. Since the number of hydrogen atoms increases as the distance to the upper surface b of the first buffer layer 111 decreases, the hydrogen in the first buffer layer 111 may diffuse to the polycrystalline silicon layer 131 more quickly and more actively in a heat treatment process.

Referring back to FIG. 1, the polycrystalline silicon layer 131 is formed on the first buffer layer 111 and may serve as an active layer of a thin-film transistor (TFT). The polycrystalline silicon layer 131 may be formed by crystallizing an amorphous silicon layer and may be a hydrogenated layer. In the hydrogenated polycrystalline silicon layer 131, dangling bonds, grain boundaries, and the like are physically or chemically bonded to hydrogen. Thus, various internal defects of the polycrystalline silicon layer 131 can be cured. For this reason, using the semiconductor device 100 in a TFT can improve characteristics of the TFT.

The concentration of hydrogen in the polycrystalline silicon layer 131 may be about 1 at. % or more. The hydrogen contained in the polycrystalline silicon layer 131 at about 1 at. % or more may substantially cure internal defects of the polycrystalline silicon layer 131.

The distribution of hydrogen in the polycrystalline layer 131 will now be described in detail with reference to FIG. 3. Referring to FIG. 3, the polycrystalline layer 131 includes a third region III and a fourth region IV. The third region III is closer to a lower surface b of the polycrystalline silicon layer 131 than the fourth region IV. For example, the third region III may contact the lower surface b of the polycrystalline silicon layer 131, and the fourth region IV may be located on the third region III. The number of hydrogen atoms in the third region III is greater than that of hydrogen atoms in the fourth region IV. In FIG. 3, a case where the number of hydrogen atoms increases from an upper surface c of the polycrystalline silicon layer 131 toward the lower surface b thereof is illustrated as an example. Consequently, the number of hydrogen atoms in the polycrystalline silicon layer 131 may be largest at an interface between the polycrystalline silicon layer 131 and the first buffer layer 111. A large number of hydrogen atoms existing at the interface between the polycrystalline silicon layer 131 and the first buffer layer 111 can substantially cure defects at the interface. In addition, since hydrogen is bonded to dangle bonds and the like, the introduction of impurities from the substrate 110 into the polycrystalline silicon layer 131 in a subsequent heat treatment process can be prevented.

Figure 4:
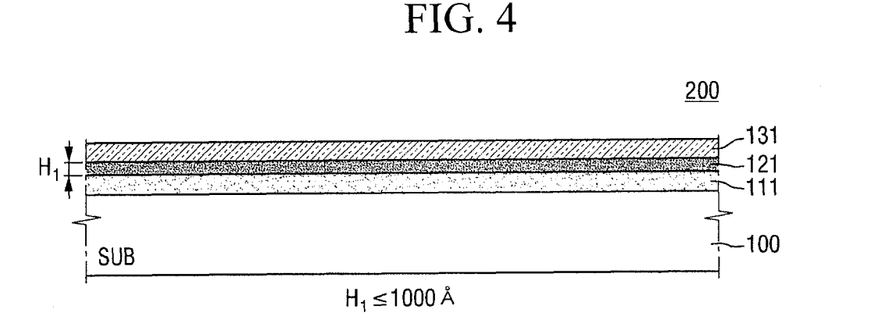
FIG. 4 is a cross-sectional view of a semiconductor device according to another embodiment.

Hereinafter, a semiconductor device according to another embodiment will be described with reference to FIG. 4. FIG. 4 is a cross-sectional view of a semiconductor device 200 according to another embodiment. The FIG. 4 embodiment is different from the previous embodiment in that a second buffer layer 121 is formed between a polycrystalline silicon layer 131 and a first buffer layer 111. Therefore, the following description will focus on this difference. Elements substantially identical to those of the previous embodiment are indicated by like reference numerals, and thus their detailed description will be omitted.

The second buffer layer 121 is formed between the first buffer layer 111 and the polycrystalline silicon layer 131 and directly contacts the two layers 111 and 131. The second buffer layer 121 may be formed of a material that is bonded to hydrogen and thus does not trap the hydrogen. For example, the second buffer layer 121 may be formed of a silicon oxide (SiOx) layer.

The thickness $H_1$ of the second buffer layer 121 may be about 1000 Å or less. The polycrystalline silicon layer 131 may be formed by crystallizing an amorphous silicon layer through heat treatment. The heat treatment causes hydrogen in the first buffer layer 111 to diffuse into the polycrystalline silicon layer 131, thereby hydrogenating the polycrystalline silicon layer 131. As a result, defects created in the polycrystalline silicon layer 131 during the crystallization process are cured. Meanwhile, the hydrogen can reach the polycrystalline silicon layer 131 only after passing through the second buffer layer 121. If the thickness $H_1$ of the second buffer layer 121 exceeds about 1000 Å, the hydrogen may not pass through the second buffer layer 121 and may return back to the first buffer layer 111. The second buffer layer 121 may be formed of a material that does not trap hydrogen, so that the hydrogen in the first buffer layer 111 can diffuse to the polycrystalline silicon layer 131 during the heat treatment process without being trapped in the second buffer layer 121. Depending on the embodiment, the thickness $H_1$ may be greater than about 1000 Å. This applies to at least one of the other buffer layers described in this disclosure.

Figure 5:
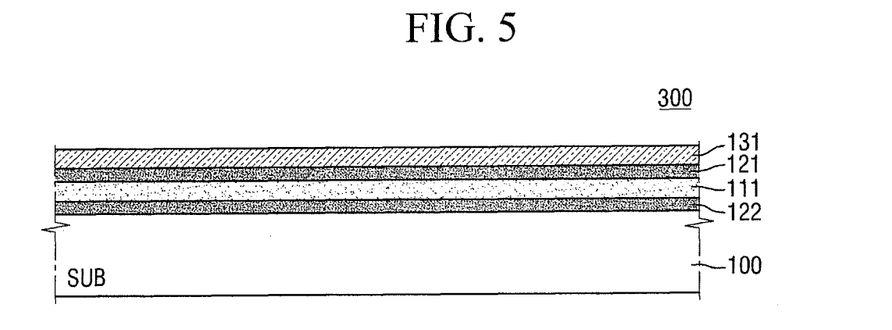
FIG. 5 is a cross-sectional view of a semiconductor device according to another embodiment.

Hereinafter, a semiconductor device according to another embodiment will be described with reference to FIG. 5. FIG. 5 is a cross-sectional view of a semiconductor device 300 according to another embodiment. The FIG. 5 embodiment is different from the previous embodiments in that a third buffer layer 122 is formed between the first buffer layer 111 and the substrate 110. Therefore, the following description will focus on this difference. Elements substantially identical to those of the previous embodiment of FIG. 4 are indicated by like reference numerals, and thus their detailed description will be omitted.

The third buffer layer 122 may be formed under the first buffer layer 111 to directly contact the first buffer layer 111. The third buffer layer 122 may ensure the flatness of the substrate 110 and substantially prevent the diffusion of impurity elements from the substrate 110 into a polycrystalline silicon layer 131. The sum of the thicknesses of the first, second and third buffer layers 111, 121 and 122 may be about 3000 Å or more. When the sum of the thicknesses is about 3000 Å or more, the buffer layers 111, 121 and 122 can collectively serve as a buffer layer that ensures the flatness of the substrate 110 and substantially prevents the diffusion of impurities. When the first buffer layer 111 and the second buffer layer 121 are thin, the third buffer layer 122 may be formed thick in order to secure the minimum thickness required for the three buffer layers 111, 121 and 122 to collectively serve as a buffer layer.

The number of hydrogen atoms in the third buffer layer 122 may be smaller than that of hydrogen atoms in the first buffer layer 111. Alternatively, the third buffer layer 122 may not contain hydrogen. In detail, the third buffer layer 122 may be formed of a silicon oxide layer.

The first buffer layer 111 may be formed of a silicon nitride layer. Here, the first buffer layer 111 may have a thickness of about 500 Å or less. A silicon nitride layer is a layer that has both tensile stress and compressive stress, and the thickness of the silicon nitride layer determines the magnitudes of the tensile stress and the compressive stress. An increase in the thickness of the silicon nitride layer tends to lead to an increase in the tensile stress rather than in the compressive stress, and the increased tensile stress causes thermal deformation of the substrate 110 under the first buffer layer 111 during a heat treatment process. When the first buffer layer 111 formed of a silicon nitride layer has a thickness of about 500 Å or less, the tensile stress of the silicon nitride layer is reduced, thus not causing the deformation of the substrate 110 during the heat treatment process. Even if the first buffer layer 111 has such a small thickness of about 500 Å or less, the minimum thickness required for the buffer layers 111, 121 and 122 to collectively serve as a buffer layer can be secured by the third buffer layer 122 disposed under the first buffer layer 111.

Figure 6:
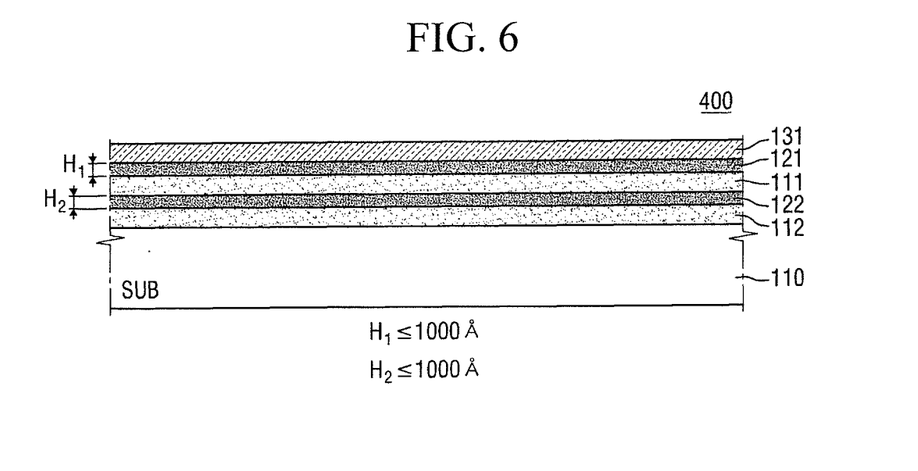
FIG. 6 is a cross-sectional view of a semiconductor device according to another embodiment.

Hereinafter, a semiconductor device according to another embodiment will be described with reference to FIG. 6. FIG. 6 is a cross-sectional view of a semiconductor device 400 according to another embodiment. The FIG. 6 embodiment is different from the previous embodiment of FIG. 5 in that a fourth buffer layer 112 is formed between the third buffer layer 122 and the substrate 110. Therefore, the following description will focus on this difference. Elements substantially identical to those of the previous embodiment of FIG. 5 are indicated by like reference numerals, and thus their detailed description will be omitted.

The fourth buffer layer 112 is formed between the third buffer layer 122 and the substrate 110 to directly contact the third buffer layer 122. The fourth buffer layer 112 may contain hydrogen and may be formed of, e.g., a silicon nitride layer. For example, the first buffer layer 111 and the fourth buffer layer 112 may be formed of hydrogen-containing silicon nitride layers, and the second buffer layer 121 and the third buffer layer 122 may be formed of silicon nitride layers. Consequently, the first buffer layer 111 and the fourth buffer layer 112 may contain hydrogen, and the second buffer layer 121 and the third buffer layer 122 may not contain hydrogen or may contain less hydrogen than the first and second buffer layers 111 and 112.

The thickness $H_2$ of the third buffer layer 122 may be about 1000 Å or less. When the fourth buffer layer 112 contains hydrogen, a heat treatment process performed to form a polycrystalline silicon layer 131 may cause the hydrogen in the fourth buffer layer 122 to move. As a result, the hydrogen may be trapped in the first buffer layer 111 or may diffuse to the polycrystalline silicon layer 131. The hydrogen trapped in the first buffer layer 111 may also diffuse to the polycrystalline silicon layer 131 in a subsequent heat treatment process. Here, if the thickness $H_2$ of the third buffer layer 122 formed directly on the fourth buffer layer 112 is about 1000 Å or more, the hydrogen in the fourth buffer layer 112 may not pass through the third buffer layer 122 and may return back to the fourth buffer layer 112. For this reason, the third buffer layer 122 may be formed to a thickness $H_2$ of about 1000 Å or less, so that the hydrogen in the fourth buffer layer 112 can smoothly diffuse to the first buffer layer 111 or the polycrystalline silicon layer 131 during a heat treatment process.

The first to fourth buffer layers 111, 121, 122 and 112 can collectively serve as a buffer layer. The sum of the thicknesses of the four buffer layers 111, 121, 122 and 112 may be about 3000 Å or more. Although not shown in the drawing, a stacked structure of the first buffer layer 111 and the second buffer layer 121 may be repeated multiple times under the first and second buffer layers 111 and 121.

Figure 7:
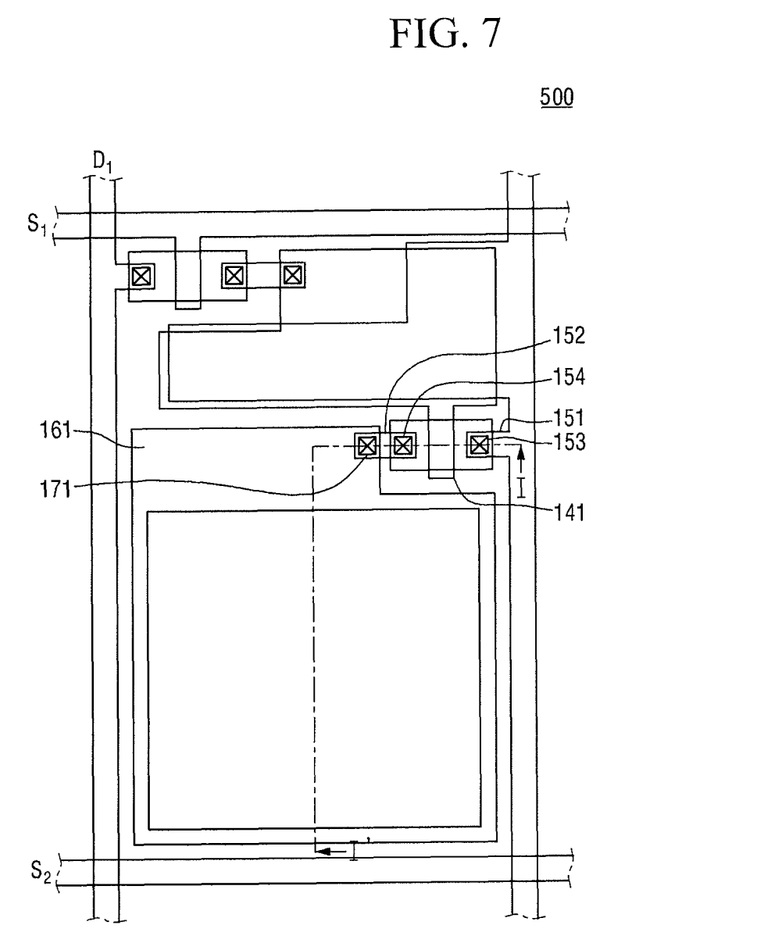
FIG. 7 is a plan view of a semiconductor device according to another embodiment.
Figure 8:
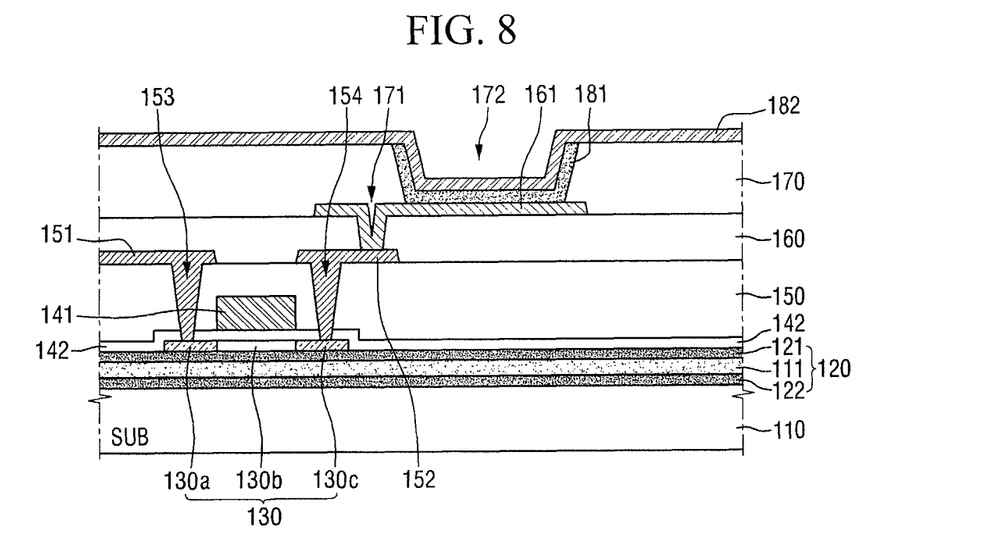
FIG. 8 is a cross-sectional view taken along the line I-I' of FIG. 7.

The above-described semiconductor devices according to various embodiments can be applied to TFTs of various devices. Examples of the applicable devices include liquid crystal displays (LCDs), electrophoretic displays (EPDs), organic light-emitting diodes (OLEDs), inorganic electroluminescent displays, field emission displays (FEDs), surface-conduction element-emitter displays (SEDs), plasma display panels (PDPs), and cathode ray tubes (CRTs). Hereinafter, an OLED to which the semiconductor device 300 of FIG. 5 is applied will be described by way of example with reference to FIGS. 7 and 8. FIG. 7 is a plan view of a semiconductor device 500 according to another embodiment. FIG. 8 is a cross-sectional view taken along the line I-I' of FIG. 7. Elements substantially identical to those of the previous embodiments of FIGS. 1 through 6 are indicated by like reference numerals, and thus their detailed description will be omitted.

Referring to FIGS. 7 and 8, the semiconductor device 500 includes a substrate 110, a buffer layer 120, an active layer 130, a gate insulating layer 142, a gate electrode 141, an interlayer insulating layer 150, source and drain electrodes 151 and 152, a passivation layer 160, a first electrode 161, a pixel defining layer 170, an organic light-emitting layer 181, and a second electrode 182.

The buffer layer 120 includes a first buffer layer 111, a second buffer layer 121, and a third buffer layer 122. The buffer layer 120 has substantially the same structure as the example structure of FIG. 5. The first buffer layer 111 may be formed of a silicon nitride layer and contain hydrogen. When the first buffer layer 111 is formed of a silicon nitride layer, it may have a thickness of about 500 Å or less in order to reduce tensile stress that causes deformation of the substrate 110 in a subsequent heat treatment process. The second buffer layer 121 is formed directly on the first buffer layer 111 and may be formed of, e.g., a silicon oxide layer. The second buffer layer 121 is formed to a thickness of about 1000 Å or less such that the hydrogen in the first buffer layer 111 can diffuse to the active layer 130 during a heat treatment process performed to form the active layer 130. The third buffer layer 122 is formed under the first buffer layer 111 to directly contact the first buffer layer and may be formed of a silicon oxide layer. The buffer layer 120 may be formed to a thickness of about 3000 Å or more in order to prevent the introduction of impurity ions (such as alkali metal ions) from the substrate 110 to the active layer 130 and planarize the surface of the substrate 110.

The active layer 130 is formed on the buffer layer 120 and includes a channel region 131b which is undoped with impurity ions and source and drain regions 131a and 131c which are formed on both sides of the channel region 131b and doped with p- or n-type impurity ions. The impurity ions may vary according to the type of a TFT. Donor impurity ions such as P, As, or Sb may be injected to manufacture an N-type TFT, and acceptor impurity ions such as B, Al, Ga or In may be injected to manufacture a P-type TFT.

The active layer 130 is formed of hydrogenated polycrystalline silicon. The active layer 130 formed of hydrogenated polycrystalline silicon as in the semiconductor device 500 according to the current embodiment has higher charge mobility than the active layer 130 formed of amorphous silicon. In addition, hydrogen cures defects inside the polycrystalline silicon, thereby improving transistor characteristics.

The gate insulating layer 142 is formed on the buffer layer 120 and the active layer 130. The gate insulating layer 142 may be formed using, for example, CVD, plasma enhanced chemical vapor deposition (PECVD), physical vapor deposition (PVD), or ALD. The gate insulating layer 142 may be formed of, but not limited to, $SiO_2$, $SiN_x$ or SiON.

The gate electrode 141 is formed on the gate insulating layer 142 to at least partially overlap with the channel region 130b of the active layer 130. The gate electrode 141 may be made of a material or a mixture of materials selected from the group consisting of Mo, W, AlNd, Ti, Al, Ag, and alloys of these materials. The gate electrode 141 may be a single layer or may be made up of two or more layers of Mo, Al or Ag, which is a material with low resistivity, in order to reduce wiring resistance. That is, the gate electrode 141 may be formed by sequentially stacking multiple conductive layers to reduce wiring resistance. Specifically, the gate electrode 141 may have a multilayered structure composed of Mo/Al/Mo, MoW/AlNd/MoW, Mo/Ag/Mo, Mo/Ag alloy/Mo, or Ti/Al/Mo.

The interlayer insulating layer 150 is formed on the gate insulating layer 142 to cover the gate electrode 141 and has a flat top surface. The interlayer insulating layer 150 not only insulates the gate electrode 141 from the source and drain electrodes 151 and 152, which are to be formed subsequently, but also planarizes substantially the entire surface of a device to facilitate a subsequent process. The interlayer insulating layer 150 includes contact holes 153 and 154 which partially expose the source and drain regions 131a and 131c of the active layer 130. The interlayer insulating layer 150 may be formed of an organic insulating layer or an inorganic insulating layer. For example, the interlayer insulating layer 150 may be made of $SiO_2$, $SiN_x$, SiON, $Al_2O_3$, $TiO_2$, $Ta_2O_5$, $HfO_2$, $ZrO_2$, BST, PZT, general-purpose polymer (such as polymethylmethacrylate (PMMA) or polystyrene (PS)), polymer derivatives having a phenol group, acrylic polymer, imide polymer, aryl ether polymer, amide polymer, fluorine polymer, p-xylene polymer, vinyl alcohol polymer, or a blend of these materials. The interlayer insulating layer 150 may be a composite stack of an inorganic insulating layer and an organic insulating layer.

The source and drain electrodes 151 and 152 are formed on the interlayer insulating layer 150 and are electrically connected to the source and drain regions 131a and 131c of the active layer 130 by the contact holes 153 and 154, respectively. Each of the source and drain electrodes 151 and 152 may be a single layer of a material selected from the group consisting of Mo, W, MoW, AlNd, Ti, Al, Al alloy, Ag, and Ag alloy. Alternatively, each of the source and drain electrodes 151 and 152 may be made up of two or more layers of a material selected from the group consisting of Mo, Al and Ag, which are materials with low resistivity, in order to reduce wiring resistance. That is, each of the source and drain electrodes 151 and 152 may have a multilayered structure composed of Mo/Al/Mo, MoW/AlNd/MoW, Ti/Al/Ti, Mo/Ag/Mo, or Mo/Ag alloy/Mo.

The passivation layer 160 is formed on the interlayer insulating layer 150 and the source and drain electrodes 151 and 152 and includes a contact hole 171 which exposes any one of the source and drain electrodes 151 and 152. The passivation layer 160 may be formed of an inorganic insulating layer or an organic insulating layer.

The first electrode 161 is formed on the passivation layer 160 and is connected to any one of the source and drain electrodes 151 and 152 by the contact hole 171 formed in the passivation layer 160. The first electrode 161 may be made of, but not limited to, a material or a mixture of materials selected from the group consisting of indium tin oxide (ITO), indium zinc oxide (IZO), tin oxide (TO), zinc oxide (ZnO), and indium oxide ($In_2O_3$).

The pixel defining layer 170 is formed on the passivation layer 160 and includes an aperture 172 which exposes a portion of the surface of the first electrode 161. The pixel defining layer 170 may be made of a material or a mixture of materials selected from the group consisting of polyacrylic resin, epoxy rein, phenol resin, polyamide resin, polyimide resin, unsaturated polyester resin, polyphenylene resin, polyphenylene sulfide resin, and benzocyclobutene.

The organic light-emitting layer 181 is formed on the portion of the first electrode 161 exposed by the aperture 172, and the second electrode 182 is formed on the organic light-emitting layer 181. When the first electrode 161 is made of a material (such as ITO) having a high work function, it may serve as an anode electrode which is a hole injection electrode, and the second electrode 182 formed on the organic light-emitting layer 181 may serve as a cathode electrode which is an electron injection electrode. However, this is a relative concept. That is, the first electrode 161 may also be the cathode electrode, and the anode electrode may be formed on the organic light-emitting layer 181. In this structure, holes and electrons are injected into the organic light-emitting layer 181, and the injected holes and electrons combine to form excitons. The excitons emit light when they fall from an excited state to a ground state.

Figure 9:
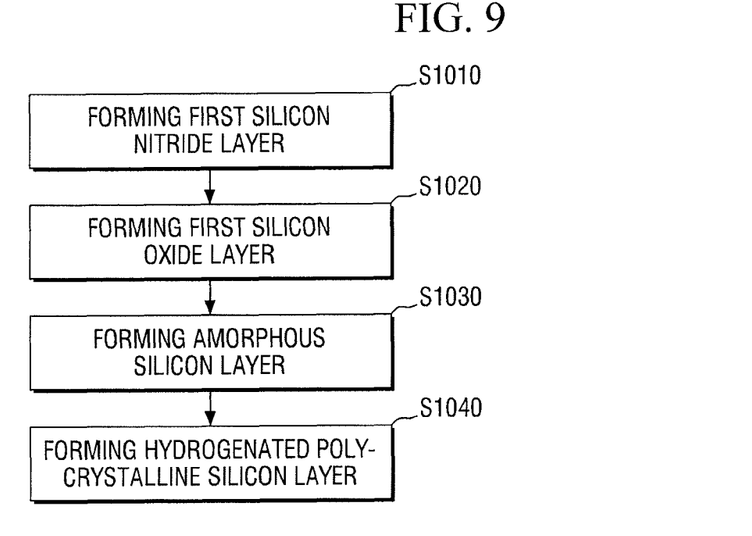
FIG. 9 is a flowchart illustrating a method of manufacturing a semiconductor device according to an embodiment.
Figure 10:
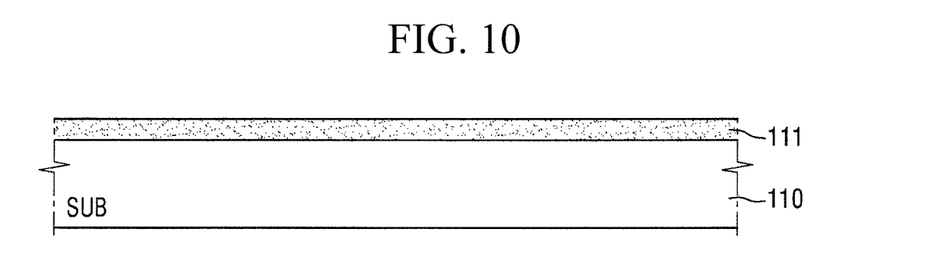
FIGS. 10 through 13 are cross-sectional views of intermediate structures illustrating the method of manufacturing a semiconductor device according to the embodiment of FIG. 9.
Figure 14:
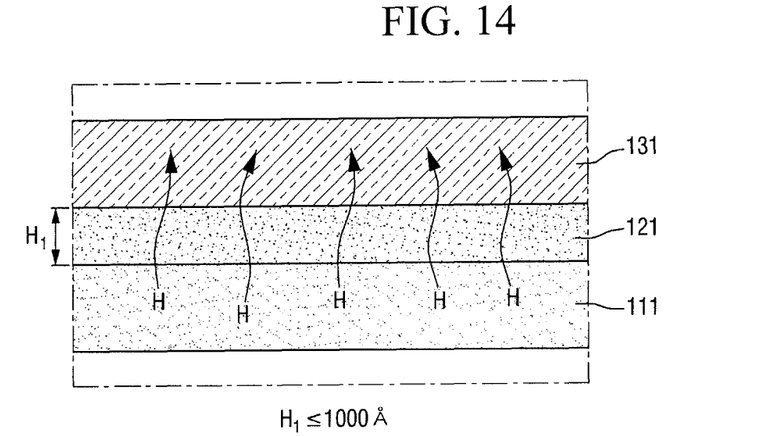
FIG. 14 is an enlarged view of a region A shown in FIG. 13 when a first silicon oxide layer has a thickness of about 1000 Å or less.
Figure 15:
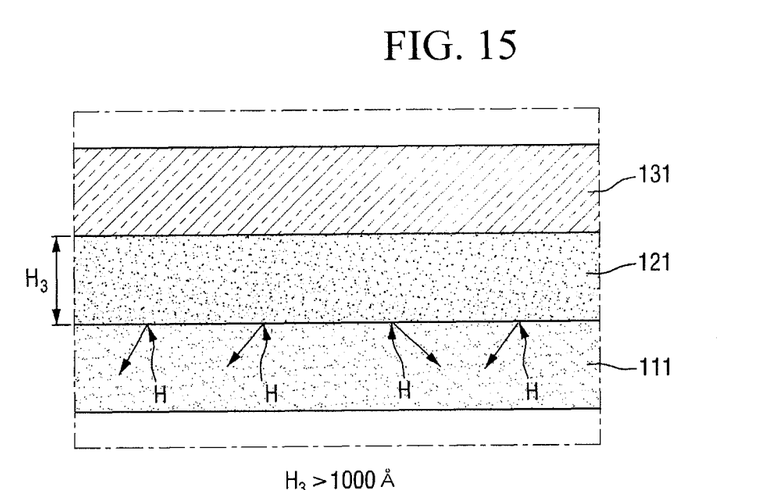
FIG. 15 is an enlarged view of the region A shown in FIG. 13 when the first silicon oxide layer has a thickness of about 1000 Å or more.

Hereinafter, a method of manufacturing a semiconductor device according to an embodiment will be described with reference to FIGS. 9 through 15. FIG. 9 is a flowchart illustrating a method of manufacturing a semiconductor device according to an embodiment. FIGS. 10 through 13 are cross-sectional views of intermediate structures illustrating the method of manufacturing a semiconductor device according to the embodiment of FIG. 4. FIG. 14 is an enlarged view of a region "A" shown in FIG. 13 when a first silicon oxide layer 121 has a thickness of about 1000 Å or less. FIG. 15 is an enlarged view of the region A shown in FIG. 13 when the first silicon oxide layer 121 has a thickness of about 1000 Å or more.

Referring to FIG. 9, a first silicon nitride layer 111 is formed on a substrate 110 (operation S1010). Specifically, a silicon oxide layer is deposited on the substrate 110 by CVD, PECVD, PVD or ALD. After a nitrogen source gas is introduced, the silicon oxide layer deposited on the substrate 110 is rapidly heat-treated at about 500° C. to about 1000° C. for about 10 seconds to about 30 seconds or is plasma-treated under a pressure condition of about 10 mTorr to about 30 mTorr and at a power of about 400 W to about 600 W. As a result, nitrogen is injected into the silicon oxide layer, thereby forming the first silicon nitride layer 111. The nitrogen source gas may be a hydrogen-containing gas such as $NH_3$. Accordingly, the hydrogen-containing first silicon nitride layer 111 may be formed. Alternatively, after the silicon oxide layer is formed, nitrogen may not be injected into the silicon oxide layer. Instead, the first silicon nitride layer 111 may be formed directly using a hydrogen-containing nitrogen source gas by CVD, PECVD, PVD, or ALD.

Figure 11:
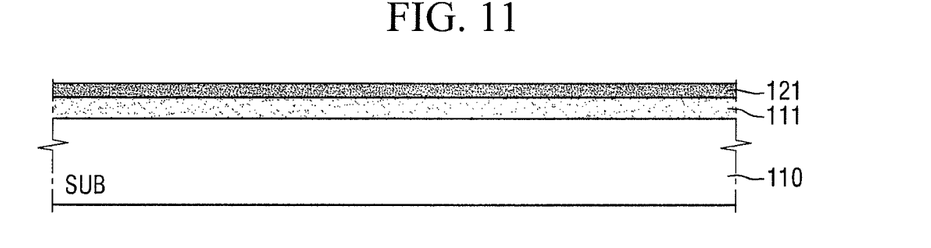

Referring to FIGS. 9 and 11, the first silicon oxide layer 121 is formed on the first silicon nitride layer 111 (operation S1020). Specifically, the first silicon oxide layer 121 is deposited on the first silicon nitride layer 111 by CVD, PECVD, PVD or ALD. Here, the thickness $H_1$ of the first silicon oxide layer 121 may be about 1000 Å or less.

The first and second silicon nitride layers 111 and 121 substantially prevent the diffusion of moisture or impurities created in the substrate 110 or control the speed of heat transfer during crystallization, thereby facilitating the crystallization of an amorphous silicon layer.

Figure 12:
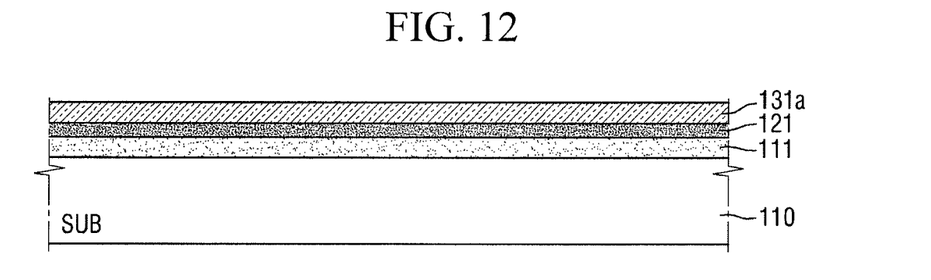
Figure 13:
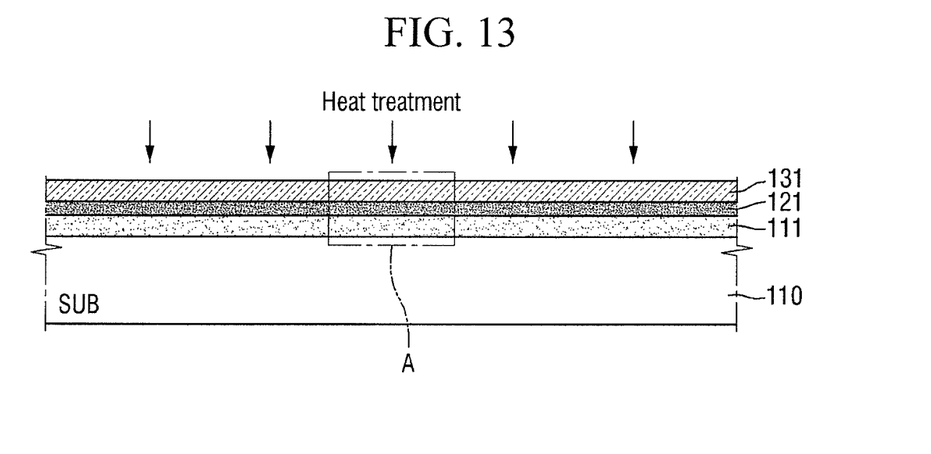

Referring to FIGS. 9, 12 and 13, an amorphous silicon layer 131a is formed on the first silicon oxide layer 121 (operation S1030) and heat-treated to form a hydrogenated polycrystalline silicon layer 131 (operation S1040). Specifically, the amorphous silicon layer 131a is formed on the first silicon oxide layer 121 by CVD, PECVD, PVD or ALD and then crystallized by heat treatment. The heat treatment process not only crystallizes the amorphous silicon layer 131a but also causes hydrogen in the first silicon nitride layer 111 to move to the polycrystalline silicon layer 131, thereby hydrogenating the polycrystalline silicon layer 131. The crystallization of the amorphous silicon layer 131a may be performed using a method such as metal induced crystallization (MIC), metal induced lateral crystallization (MILC), super grain silicon crystallization (SGC), or solid phase crystallization (SPC). The heat treatment process may be performed at a temperature of about 300° C. to about 1000° C. for several seconds to several minutes. The heat treatment process performed in the above temperature and time ranges not only substantially prevents the deformation of the substrate 110 caused by excessive heat treatment but also induces the diffusion of hydrogen in the first silicon nitride layer 111 to crystallize the amorphous silicon layer 131a and substantially cure defects inside the polycrystalline silicon layer 131. The heat treatment process may be performed using furnace annealing, rapid thermal annealing (RTA), UV annealing, or laser annealing.

After the heat treatment process, the concentration of hydrogen in the polycrystalline silicon layer 131 may be about 1 at. % or more. When the polycrystalline silicon layer 131 is formed by crystallizing the amorphous silicon layer 131a, the hydrogen concentration may be reduced due to dehydrogenation. In the current embodiment, however, the concentration of hydrogen in the polycrystalline silicon layer 131 can be maintained at about 1 at. % or more since hydrogen is supplied from the first silicon nitride layer 111. Accordingly, defects formed in the polycrystalline silicon layer 131 can be substantially cured.

The hydrogenation of the polycrystalline silicon layer 131 by heat treatment will now be described with reference to FIGS. 14 and 15. Referring to FIG. 14, the amorphous silicon layer 131a is crystallized by heat treatment, and the diffusion of hydrogen from the first silicon nitride layer 111 starts substantially at the same time as the crystallization of the amorphous silicon layer 131a. Here, if the first silicon oxide layer 121 formed directly on the first silicon nitride layer 111 has a thickness $H_1$ of about 1000 Å or less, hydrogen atoms can pass through the first silicon oxide layer 121 to diffuse into the polycrystalline silicon layer 131, thereby hydrogenating the polycrystalline silicon layer 131. On the other hand, referring to FIG. 15, if the first silicon oxide layer 121 has a thickness $H_3$ of about 1000 Å or more, the hydrogen atoms in the first silicon nitride layer 111 may not pass through the first silicon oxide layer 121. Furthermore, the hydrogen atoms may bounce off the surface of the first silicon oxide layer 121 and return to the first silicon nitride layer 121, thus failing to reach the polycrystalline silicon layer 131.

As a result of the above heat treatment process, the number of hydrogen atoms in the first silicon nitride layer 111 may increase as the distance to an upper surface of the first silicon nitride layer 111 decreases. In addition, the number of hydrogen atoms in the polycrystalline silicon layer 131 may increase as the distance to a lower surface of the polycrystalline silicon layer 131 decreases.

In the method of manufacturing a semiconductor device according to the current embodiment, a hydrogen-containing silicon nitride layer is formed, and a silicon oxide layer is formed to a thickness that allows hydrogen to pass through the silicon oxide layer. Therefore, hydrogen in the silicon nitride layer diffuses to a polycrystalline silicon layer during crystallization. This may negate the need to perform an additional process for curing defects of the polycrystalline silicon layer. Furthermore, since the polycrystalline silicon layer formed on a large-area substrate can be hydrogenated uniformly, uniform TFT characteristics can be secured.

Figure 16:
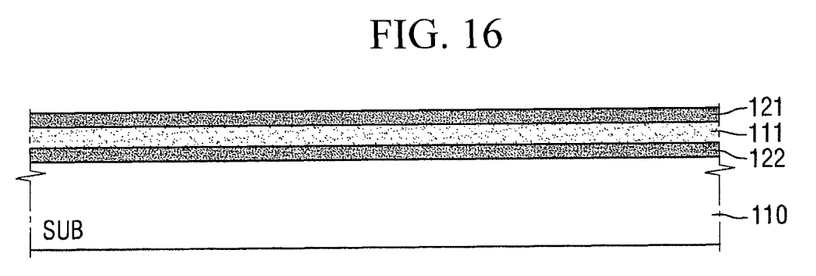
FIG. 16 is a cross-sectional view of an intermediate structure illustrating a method of manufacturing a semiconductor device according to another embodiment.

Hereinafter, a method of manufacturing a semiconductor device according to another embodiment will be described with reference to FIG. 16. FIG. 16 is a cross-sectional view of an intermediate structure illustrating a method of manufacturing a semiconductor device according to another embodiment. The current embodiment is different from the previous embodiment in that a process of FIG. 16 is additionally performed. Thus, the following description will focus on this difference.

Referring to FIG. 16, a second silicon oxide layer 122 is formed under a first silicon nitride layer 111. Specifically, the second silicon oxide layer 122 is formed under the first silicon nitride layer 111 by CVD, PECVD, PVD or ALD to directly contact the first silicon nitride layer 111.

Selected benefits of at least one of the disclosed embodiments will be described in further detail with reference to the following experimental examples.

Experimental Example 1

Figure 17:
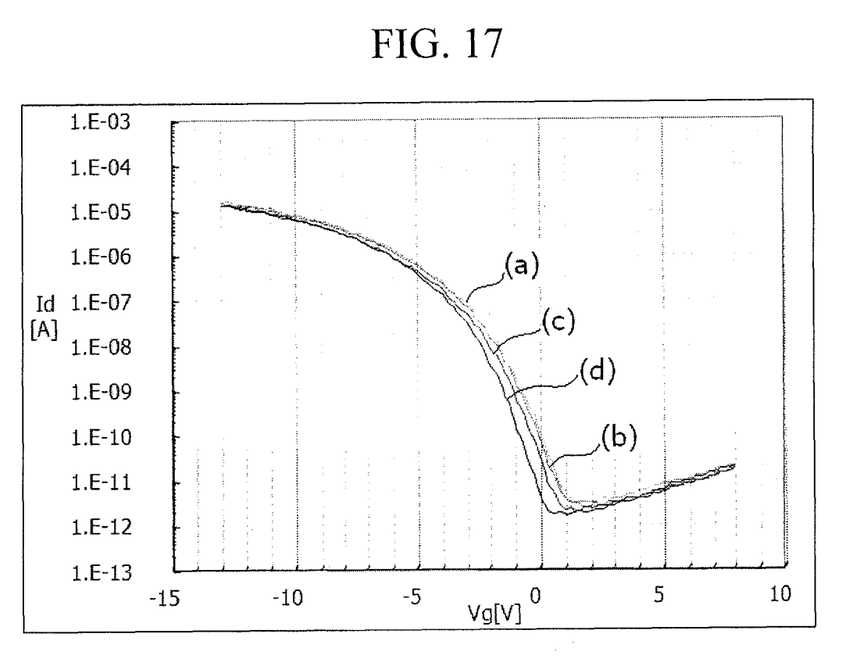
FIG. 17 is a graph of $V_{th}$ with respect to the thickness of a silicon oxide layer.

TFT Characteristics with Respect to the Thickness of First Silicon Oxide Layer (1) A buffer layer including a second silicon oxide layer 122, a first silicon nitride layer 111 and a first silicon oxide layer 121 was formed on a substrate 110, and amorphous silicon was deposited on the buffer layer, as shown in FIG. 5. Then, the resultant structure was rapidly heat-treated at a temperature of about 700° C. for three minutes, thereby crystallizing and hydrogenating the amorphous silicon layer. Here, a total thickness of the buffer layer was about 3000 Å, a thickness of the first silicon nitride layer 111 was about 500 Å, and a thickness of the first silicon oxide layer 121 was about 300 Å. After the buffer layer and a polycrystalline silicon layer were formed as described above, impurities were injected into the polycrystalline silicon layer to form an active layer which included a channel region and source and drain regions. In a subsequent process, a TFT was manufactured. As a way to evaluate characteristics of the TFT, $V_{th}$ (a voltage at a current value of 1.0 nA) was measured, and the results are represented by a curve (a) of FIG. 17. In FIG. 17, the vertical axis is the current value, and the horizontal axis is the voltage value.

(2) An experiment was conducted in the same way as (1) except that the thickness of the first silicon oxide layer 121 was 500 Å, and the results are represented by a curve (b) of FIG. 17.

(3) An experiment was conducted in the same way as (1) except that the thickness of the first silicon oxide layer 121 was 1000 Å, and the results are represented by a curve (c) of FIG. 17.

(4) An experiment was conducted in the same way as (1) except that the thickness of the first silicon oxide layer 121 was 1100 Å, and the results are represented by a curve (d) of FIG. 17.

Referring to FIG. 17, when the first silicon oxide layer 121 has a thickness of about 1000 Å or more, $V_{th}$ increases. When the first silicon oxide layer 121 has a thickness of about 1000 Å or more, hydrogen in the first silicon nitride layer 111 will generally not pass through the first silicon oxide layer 121. Accordingly, the polycrystalline silicon layer will not be hydrogenated, substantially preventing deterioration of TFT characteristics.

What is claimed is:

1. A semiconductor device comprising:
a substrate;
a first buffer layer formed over the substrate, wherein the first buffer layer contains hydrogen; and
an active layer formed on the first buffer layer and containing polycrystalline silicon and hydrogen,
wherein the concentration of the hydrogen contained in the active layer is about 1 atomic percent (at. %) or more,
wherein the device further comprises a second buffer layer formed between and contacting the first buffer layer and the active layer, wherein the second buffer layer contains a smaller amount of hydrogen than the hydrogen in the first buffer layer and the hydrogen in the active layer,
wherein the first buffer layer comprises a first region and a second region located below the first region, and wherein the first region contains a greater amount of hydrogen than the second region,
wherein the active layer comprises a third region and a fourth region located on the third region, and wherein the third region contains a greater amount of hydrogen than the fourth region.

2. The semiconductor device of claim 1, wherein the thickness of the second buffer layer is about 1000 Å or less.

3. The semiconductor device of claim 1, further comprising a third buffer layer formed between the substrate and the first buffer layer.

4. The semiconductor device of claim 1, wherein the first buffer layer comprises silicon nitride, and wherein the second buffer layer comprises silicon oxide.

5. The semiconductor device of claim 1, wherein the active layer comprises a channel region and source and drain regions which are formed on both sides of the channel region and are doped with impurities, and wherein the semiconductor device further comprises;
a gate electrode formed on the active layer to at least partially overlap with the channel region;
an interlayer insulating layer formed on the substrate to cover the gate electrode and having contact holes which at least partially expose the source and drain regions;
source and drain electrodes filling the contact holes and formed on the interlayer insulating layer to be connected to the source and drain regions, respectively;
a passivation layer formed on the interlayer insulating layer to cover the source and drain electrodes;
a first electrode formed on the passivation layer and connected to at least one of the source and drain electrodes; and
a pixel defining layer formed on the passivation layer to expose the first electrode.

6. A semiconductor device comprising:
a substrate;
a first buffer layer formed over the substrate, wherein the first buffer layer contains hydrogen; and
an active layer formed on the first buffer layer and containing polycrystalline silicon and hydrogen,
wherein the concentration of the hydrogen contained in the active layer is about 1 atomic percent (at. %) or more,
wherein the device further comprises a second buffer layer formed between and contacting the first buffer layer and the active layer, wherein the second buffer layer contains a smaller amount of hydrogen than the hydrogen in the first buffer layer and the hydrogen in the active layer,
wherein the semiconductor device further comprises:

a third buffer layer formed between the substrate and the first buffer layer, and a fourth buffer layer formed between and contacting the third buffer layer and the substrate, wherein the fourth buffer layer contains hydrogen, and wherein the second and third buffer layers contain a smaller amount of hydrogen than the first and fourth buffer layers.

7. A method of manufacturing a semiconductor device, the method comprising:

forming a first silicon nitride layer over a substrate, wherein the first silicon nitride layer contains hydrogen;

forming a first silicon oxide layer on the first silicon nitride layer;

forming an amorphous silicon layer directly on the first silicon oxide layer, wherein the amorphous silicon layer contains hydrogen, and wherein the first silicon oxide layer contains a smaller amount of hydrogen than the hydrogen in the first silicon nitride layer and the hydrogen in the amorphous silicon layer; and heat-treating the first silicon nitride layer, the first silicon oxide layer and the amorphous silicon layer so as to form a hydrogenated polycrystalline silicon layer, wherein the forming of the first silicon nitride layer comprises:

forming a silicon oxide layer for a nitride layer on the substrate; and injecting nitrogen into the silicon oxide layer for a nitride layer using a hydrogen-containing nitrogen source gas, wherein the method further comprises:

forming a second silicon oxide layer between the substrate and the first silicon nitride layer; and forming a second silicon nitride layer, containing hydrogen, between the substrate and the second silicon oxide layer to contact the second silicon oxide layer.

8. The method of claim 7, wherein the second silicon oxide layer has a thickness of about 1000 Å or less.

* * * * *